(12) United States Patent
Wang et al.

(10) Patent No.: US 10,970,517 B2
(45) Date of Patent: Apr. 6, 2021

(54) TEXTURE RECOGNITION DEVICE AND OPERATION METHOD OF TEXTURE RECOGNITION DEVICE

(71) Applicant: BOE TECHNOLOGY GROUP CO., LTD., Beijing (CN)

(72) Inventors: Lei Wang, Beijing (CN); Haisheng Wang, Beijing (CN); Changfeng Li, Beijing (CN); Xiaoquan Hai, Beijing (CN); Lin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/599,221

(22) Filed: Oct. 11, 2019

(65) Prior Publication Data

US 2020/0279086 A1 Sep. 3, 2020

(30) Foreign Application Priority Data

Feb. 28, 2019 (CN) .......................... 201910152923.1

(51) Int. Cl.
| | |
|---|---|
| *G06K 9/00* | (2006.01) |
| *G02F 1/13357* | (2006.01) |
| *G02F 1/1333* | (2006.01) |
| *H01L 27/146* | (2006.01) |
| *H01L 27/32* | (2006.01) |

(52) U.S. Cl.
CPC ......... *G06K 9/001* (2013.01); *G02F 1/13338* (2013.01); *G02F 1/133606* (2013.01); *G06K 9/0004* (2013.01); *G06K 9/0008* (2013.01); *G06K 9/00046* (2013.01); *G06K 9/00073* (2013.01); *H01L 27/146* (2013.01); *H01L 27/3234* (2013.01); *H01L 27/3246* (2013.01)

(58) Field of Classification Search
CPC ........................................ G06K 9/00006–0012
See application file for complete search history.

(56) References Cited

U.S. PATENT DOCUMENTS

| | | | | |
|---|---|---|---|---|
| 10,229,308 | B2* | 3/2019 | Wang | G06K 9/0004 |
| 10,572,085 | B2* | 2/2020 | Jung | G06F 3/044 |
| 10,614,282 | B2* | 4/2020 | Cao | G06K 9/0004 |
| 10,679,034 | B2* | 6/2020 | Shen | G09G 3/20 |
| 10,720,099 | B2* | 7/2020 | Feng | G09G 3/3688 |
| 10,726,236 | B2* | 7/2020 | Li | G06K 9/0004 |

(Continued)

FOREIGN PATENT DOCUMENTS

CN 106529463 A * 3/2017 ......... G06K 9/00087

*Primary Examiner* — Patrick F Marinelli

(57) ABSTRACT

An operation method of a texture recognition device and a texture recognition device are provided. The texture recognition device includes a light source array and an image sensor array; the light source array includes a plurality of light sources; the image sensor array includes a plurality of groups of image sensors; and the operation method includes: in a first period, allowing the light source array to operate to provide a first photosensitive light source, allowing a first group of image sensors that can receive first light emitted by the first photosensitive light source and reflected by the texture to be in a state of sensing and generating a detection electrical signal, and allowing at least one group of image sensors that can receive the first light except the first group of image sensors to be in a state of not sensing and not generating a detection electrical signal.

15 Claims, 10 Drawing Sheets

(56) References Cited

U.S. PATENT DOCUMENTS

| | | | | |
|---|---|---|---|---|
| 2018/0314872 A1* | 11/2018 | Ding | .................... | G06K 9/0004 |
| 2018/0357464 A1* | 12/2018 | Wang | .................. | H01L 27/3234 |
| 2018/0365473 A1* | 12/2018 | Wang | .................. | G09G 3/3426 |
| 2019/0012509 A1* | 1/2019 | Li | ........................ | G09G 3/3208 |
| 2019/0138123 A1* | 5/2019 | Jung | .................. | G06F 3/04166 |
| 2019/0180072 A1* | 6/2019 | Fomani | .............. | G06K 9/00046 |
| 2019/0377924 A1* | 12/2019 | Shen | ...................... | G06K 9/209 |
| 2020/0035151 A1* | 1/2020 | Feng | .................. | G09G 3/3233 |
| 2020/0184179 A1* | 6/2020 | Hai | ........................ | G06F 3/042 |
| 2020/0275001 A1* | 8/2020 | Jhang | .................. | G06K 9/0002 |
| 2020/0279086 A1* | 9/2020 | Wang | .................. | G02F 1/13338 |

* cited by examiner

TEXTURE RECOGNITION DEVICE AND OPERATION METHOD OF TEXTURE RECOGNITION DEVICE

The application claims priority to the Chinese patent application No. 201910152923.1, filed on Feb. 28, 2019, the entire disclosure of which is incorporated herein by reference as part of the present application.

TECHNICAL FIELD

At least one embodiment of the present disclosure relates to a texture recognition device and an operation method of a texture recognition device.

BACKGROUND

With increasing popularity of mobile terminals, more and more users use mobile terminals to perform operations such as identity verification, electronic payment and so on. Because of the uniqueness of skin textures such as fingerprint patterns or palm print patterns, fingerprint identification technology combined with optical imaging is gradually adopted by mobile electronic devices for identity verification, electronic payment, etc. How to design a more optimized display panel structure is a focus problem in the art.

SUMMARY

At least one embodiment of the present disclosure provides an operation method of a texture recognition device, the texture recognition device comprises a light source array and an image sensor array; the light source array comprises a plurality of light sources, and the image sensor array comprises a plurality of groups of image sensors; each group of the plurality of groups of image sensors comprises a plurality of image sensors, the image sensor array is configured to receive light emitted from the light source array and reflected to the image sensor array by a texture for a texture collection, and the plurality of groups of image sensors comprise a first group of image sensors; and the operation method comprises: in a first period, allowing the light source array to operate to provide a first photosensitive light source, allowing the first group of image sensors, which is capable of receiving first light emitted by the first photosensitive light source and reflected by the texture, to be in a state of sensing and generating a detection electrical signal, and allowing at least one group of image sensors that is capable of receiving the first light except the first group of image sensors to be in a state of not sensing and not generating a detection electrical signal.

For example, in the operation method provided by at least one embodiment of the present disclosure, the plurality of groups of image sensors further comprise a second group of image sensors, and the operation method further comprises: in a second period different from the first period, allowing the light source array to operate to provide a second photosensitive light source, allowing the second group of image sensors, which is capable of receiving second light emitted by the second photosensitive light source and reflected by the texture, to be in a state of sensing and generating a detection electrical signal, and allowing at least one group of image sensors that is capable of receiving the second light except the second group of image sensors to be in a state of not sensing and not generating a detection electrical signal; the first photosensitive light source does not overlap with the second photosensitive light source.

For example, in the operation method provided by at least one embodiment of the present disclosure, the texture recognition device comprises a pixel unit array, wherein the pixel unit array comprises a plurality of pixel units, and each of the plurality of pixel units comprises one light emitting component; the plurality of light sources comprise light emitting components of the plurality of pixel units; and the plurality of pixel units comprise a first group of pixel units that are arranged continuously; allowing the light source array to operate to provide the first photosensitive light source comprises: in the first period, lighting the first group of pixel units to form a first line light source as the first photosensitive light source.

For example, in the operation method provided by at least one embodiment of the present disclosure, each image sensor of the plurality of groups of image sensors comprises a photosensitive component, allowing the first group of image sensors to be in the state of sensing and generating the detection electrical signal and allowing the at least one group of image sensors except the first group of image sensors to be in the state of not sensing and not generating the detection electrical signal comprise: allowing photosensitive components in the first group of image sensors to be under negative bias, and allowing photosensitive components in the at least one group of image sensors except the first group of image sensors to be under non-negative bias.

For example, in the operation method provided by at least one embodiment of the present disclosure, the non-negative bias comprises positive bias or zero bias.

For example, in the operation method provided by at least one embodiment of the present disclosure, a first terminal of each of the photosensitive components of a same group of the plurality of groups of image sensors is connected with a same bias line, photosensitive components of different groups of image sensors are respectively connected with different bias lines, and the different bias lines are respectively connected with a bias bus through first switch components; and the operation method comprises: in the first period, turning on a first switch component connected with the bias line which is connected with the first group of image sensors, and in the second period, turning on a first switch component connected with the bias line which is connected with the second group of image sensors.

For example, in the operation method provided by at least one embodiment of the present disclosure, the image sensor array comprises a plurality of columns, each group of the plurality of groups of image sensors comprises image sensors in the plurality of columns, and for a same column of the plurality of columns, a same group of the plurality of groups of image sensors are connected with a same signal readout line, different groups of image sensors are respectively connected with different signal readout lines, and the different signal readout lines are respectively connected with a signal readout bus through second switch components; and the operation method comprises: in the first period, turning on a second switch component connected with the signal readout line which is connected with the first group of image sensors, and in the second period, turning on a second switch component connected with the signal readout line which is connected with the second group of image sensors.

For example, in the operation method provided by at least one embodiment of the present disclosure, the plurality of groups of image sensors comprise a third group of image sensors, and the operation method further comprises: in a third period different from the first period and the second period, allowing the light source array to operate to provide a third photosensitive light source, allowing the third group of image sensors, which is capable of receiving third light emitted by the third photosensitive light source and reflected by the texture, to be in a state of sensing and generating a detection electrical signal, and allowing at least one group of image sensors that is capable of receiving the third light except the third group of image sensors to be in a state of not sensing and not generating a detection electrical signal; the third photosensitive light source does not overlap with the first photosensitive light source, and the third photosensitive light source does not overlap with the second photosensitive light source.

At least one embodiment of the present disclosure further provides a texture recognition device, the texture recognition device comprises a light source array and an image sensor array; the light source array comprises a plurality of light sources; the image sensor array comprises a plurality of groups of image sensors; the image sensor array is configured to receive light emitted from the light source array and reflected to the image sensor array by a texture for a texture collection; and the image sensor array comprises a first group of image sensors and at least one group of image sensors except the first group of image sensors, and is configured to allow the first group of image sensors to be in a state of sensing and generating a detection electrical signal while allowing the at least one group of image sensors except the first group of image sensors to be in a state of not sensing and not generating a detection electrical signal.

For example, in the texture recognition device provided by at least one embodiment of the present disclosure, the image sensor array further comprises a second group of image sensors, and is further configured to allow the second group of image sensors to be in a state of sensing and generating a detection electrical signal while allowing at least one group of image sensors except the second group of image sensors to be in a state of not sensing and not generating a detection electrical signal.

For example, the texture recognition device provided by at least one embodiment of the present disclosure further comprises a controller; the controller is configured to, in a first period, control the light source array to operate to provide a first photosensitive light source, allow the first group of image sensors, which is capable of receiving first light emitted by the first photosensitive light source and reflected by the texture, to be in a state of sensing and generating a detection electrical signal, and allow at least one group of image sensors that is capable of receiving the first light except the first group of image sensors to be in a state of not sensing and not generating a detection electrical signal; and the controller is also configured to, in a second period, control the light source array to operate to provide a second photosensitive light source, allow the second group of image sensors, which is capable of receiving second light emitted by the second photosensitive light source and reflected by the texture, to be in a state of sensing and generating a detection electrical signal, and allow at least one group of image sensors that is capable of receiving the second light except the second group of image sensors to be in a state of not sensing and not generating a detection electrical signal; the first photosensitive light source does not overlap with the second photosensitive light source.

For example, the texture recognition device provided by at least one embodiment of the present disclosure further comprises a pixel unit array, wherein the pixel unit array comprises a plurality of pixel units, and each of the plurality of pixel units comprises one light emitting component; the plurality of light sources comprise light emitting components of the plurality of pixel units; the plurality of pixel units comprise a first group of pixel units that are arranged continuously; and the controller is configured to light the first group of pixel units to form the first photosensitive light source in the first period.

For example, in the texture recognition device provided by at least one embodiment of the present disclosure, each of the plurality of pixel units further comprises one image sensor of the plurality of groups of image sensors, and the plurality of light emitting components and the plurality of groups of image sensors are in a same layer and are spaced apart from each other.

For example, in the texture recognition device provided by at least one embodiment of the present disclosure, each image sensor of the plurality of groups of image sensors comprises a photosensitive component, a first terminal of each photosensitive component of a same group of the plurality of groups of image sensors is connected with a same bias line, photosensitive components of different groups of image sensors are respectively connected with different bias lines, and the different bias lines are respectively connected with a bias bus through first switch components.

For example, in the texture recognition device provided by at least one embodiment of the present disclosure, the image sensor array comprises a plurality of columns, each group of the plurality of groups of image sensors comprises image sensors in the plurality of columns, and for a same column of the plurality of columns, a same group of the plurality of groups of image sensors are connected with a same signal readout line, different groups of image sensors are respectively connected with different signal readout lines, and the different signal readout lines are respectively connected with a signal readout bus through second switch components.

For example, in the texture recognition device provided by at least one embodiment of the present disclosure, a control electrode of the first switch component and a control electrode of the second switch component, in which the first switch component and the second switch component are connected with a same group of the plurality of groups of image sensors, are connected with a same selection line, and a control electrode of the first switch component and a control electrode of the second switch component, in which the first switch component and the second switch component are connected with different groups of the plurality of groups of image sensors, are connected to different selection lines, respectively.

For example, in the texture recognition device provided by at least one embodiment of the present disclosure further comprises a color filter layer, which is at least at a light input side of the image sensor array, and configured to filter light of a wavelength larger than 600 nm.

For example, in the texture recognition device provided by at least one embodiment of the present disclosure, the color filter layer comprises a planarization layer, or the color filter layer comprises a pixel defining layer, or the color filter layer comprises the planarization layer and the pixel defining layer.

For example, in the texture recognition device provided by at least one embodiment of the present disclosure, the light emitting component comprises an organic light emitting diode or a quantum dot light emitting diode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various under-screen texture recognition function components. Also, the terms "a," "one," or "the" and the like are not intended to indicate any limitation to amounts, but represent at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

At present, a technology of narrow border display screen is gradually becoming a mainstream, especially for portable display devices such as mobile phones. One means to realize this technology is to integrate image sensors with a fingerprint recognition function into a display screen, which realizes an under-screen fingerprint recognition mode and increases an area of a display region of the display screen, and therefore increases a screen occupation proportion.

For example, a point light source, a line light source, or a light source of a certain pattern may be used as a photosensitive light source of the image sensor for fingerprint recognition. In the following, the principle of fingerprint recognition is introduced by taking the line light source being used as the photosensitive light source of the image sensor as an example.

Figure 1A:
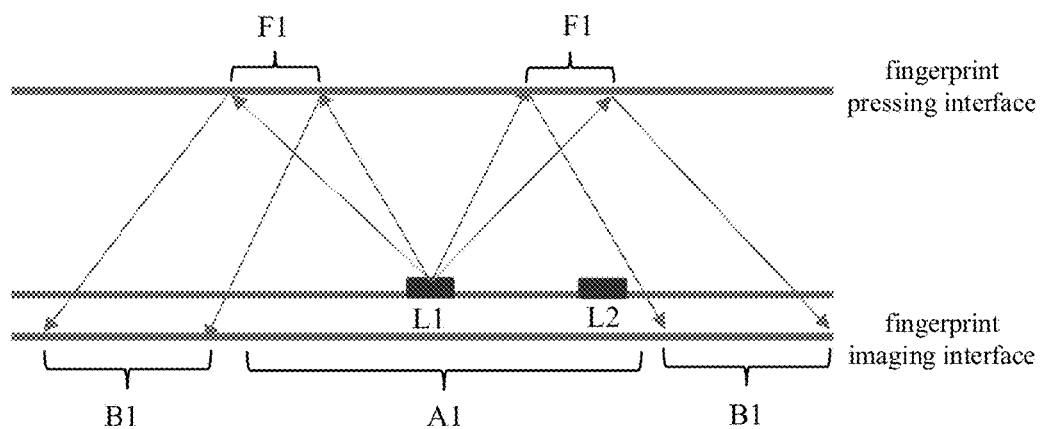
FIG. 1A is a principle diagram of forming a texture image using a photosensitive light source.

In a reflective optical fingerprint recognition device, during a process of fingerprint recognition, as illustrated in FIG. 1A, when a line light source L1 emits light, the light emitted by the line light source L1 is incident to a fingerprint pressing interface (for example, an outer surface of a screen). Because of a total reflection generated on the fingerprint pressing interface, a part of the light whose incident angle is larger than or equal to the critical angle θ of the total reflection is totally reflected, which results in that this part of the light cannot emit out from the fingerprint pressing interface, thus generating a total reflection region. Accordingly, a part of the light whose incident angle is smaller than the critical angle θ of the total reflection emits out from the fingerprint pressing interface. Therefore, a texture image can be collected by the light reflected by the total reflection region, for example, a clear texture image is formed in a region B1 of a fingerprint imaging interface, the texture image corresponds to the part of the fingerprint in a region F1, and the region F1 is the total reflection region.

Specifically, when a ridge of the fingerprint touches the total reflection region F1, the total reflection condition of the corresponding position is destroyed, while when a valley of the fingerprint touches the total reflection region, the total reflection condition of the corresponding position is not destroyed. In this way, because of the different effects caused by the valley and the ridge of the fingerprint on the total reflection condition of light in the total reflection region, light incident to the fingerprint imaging interface forms a texture image of bright stripes and dark stripes that are alternate with each other at different positions. In addition, because of interference caused by light emitted from the photosensitive light source and reflected by internal structures of the device, a region A1 of the fingerprint imaging interface becomes a highlight region with invalid detection, and a texture image cannot be formed in this highlight region. Therefore, in order to obtain a complete texture image, a part of the texture image corresponding to the highlight region A1 needs to be detected additionally.

Figure 1B:
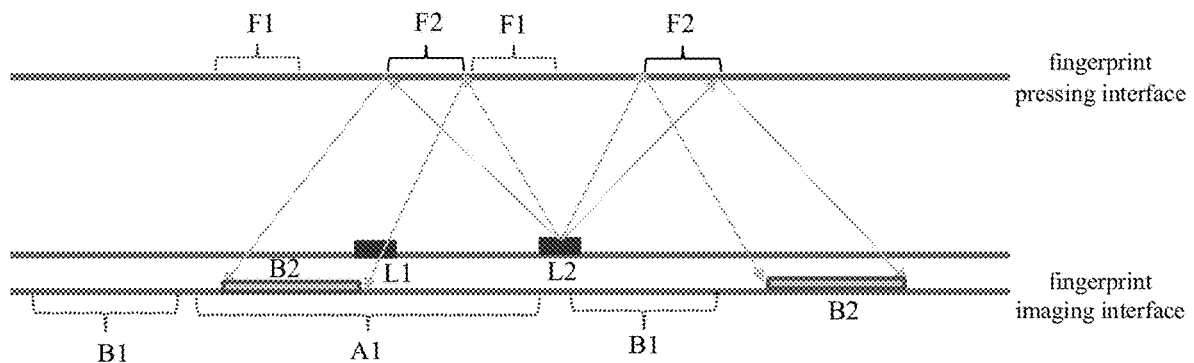
FIG. 1B is a principle diagram showing interference caused by a residual image on a texture image.

For example, as illustrated in FIG. 1B, after the line light source L1 is lighted to form a first frame texture image in a region B1, another light source L2 is lighted to acquire a second frame texture image. However, the first frame of texture image has a portion overlapping with the second frame texture image, and thus the image sensor(s) for acquiring the portion of the first frame texture image overlapping with the second frame texture image needs to be further used for acquiring the second frame texture image after acquiring the first frame texture image. When the image sensor(s) acquires the second frame texture image, because internal electrical signals of the image sensor(s) need a certain period of time to be released completely, if the second frame texture image is acquired before the internal electrical signals are released completely, a residual signal and a signal which is for forming the second frame texture image are superposed, resulting in the second frame texture image having a residual shadow.

Figure 2A:
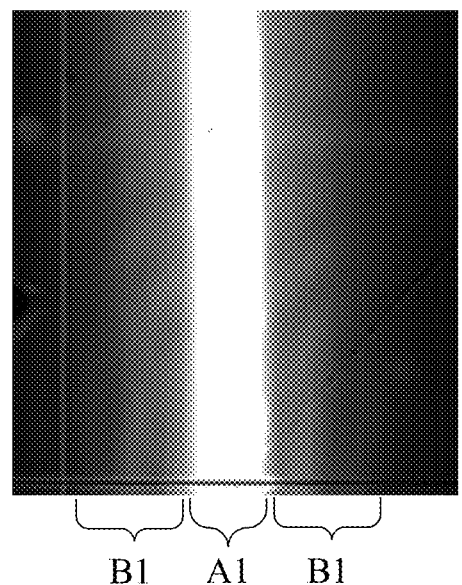
FIG. 2A is a texture image formed by a photosensitive light source.
Figure 2B:
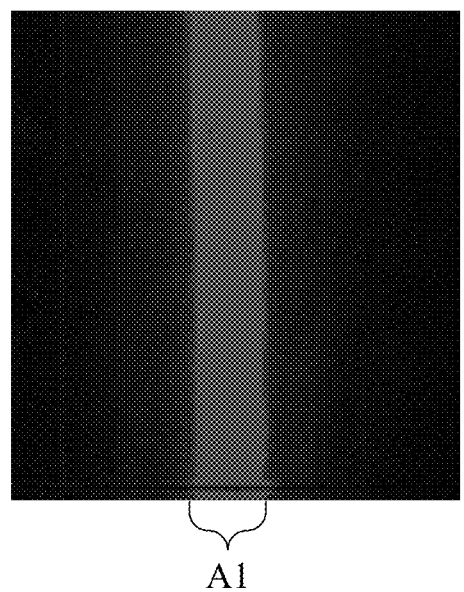
FIG. 2B is a residual image.

As illustrated in FIG. 1B, under the action of the light source L2, light incident to a part of the fingerprint located in a region F2 is totally reflected, and a texture image is formed in a region B2 of the fingerprint imaging interface. However, a part of the texture image in the region B2 formed by the light source L2 (the part on the left in the figure) overlaps with the highlight region A1 formed by the light source L1, and therefore the image sensor(s) corresponding to the highlight region A1 does not fully release photogenerated charges, thus generating a residual image in the second frame texture image, which seriously affects the definition and accuracy of the second frame texture image. For example, FIG. 2A is a texture image formed by the line light source L1, and FIG. 2B is a residual image of the texture image of FIG. 2A in the second frame texture image, and this residual image seriously affects the definition and accuracy of the second frame texture image.

For example, the texture image can be collected in a time-sharing manner. In this time-sharing manner, after one frame of the texture image is collected, another frame of clear and accurate texture image can be obtained only after waiting for a certain period of time, otherwise the residual image of the previous frame of the texture image that did not disappear is superposed with the next frame of texture image, which makes the final image texture unclear and inaccurate. However, waiting for a certain time increases an acquisition time of the texture image, which affects user experience. Or, even if the image sensor is reset after the first frame texture image is collected, the electrical signals in some image sensors, such as the image sensor corresponding to the highlight region, cannot be completely eliminated, and therefore a residual image is also formed in the texture image formed later.

At least one embodiment of the present disclosure provides an operation method of a texture recognition device, and the texture recognition device comprises a light source array and an image sensor array; the light source array comprises a plurality of light sources, and the image sensor array comprises a plurality of groups of image sensors; each group of the plurality of groups of image sensors comprises a plurality of image sensors, the image sensor array is configured to receive light emitted from the light source array and reflected to the image sensor array by a texture for a texture collection, and the plurality of groups of image sensors comprise a first group of image sensors; and the operation method comprises: in a first period, allowing the light source array to operate to provide a first photosensitive light source, allowing the first group of image sensors that can receive first light emitted by the first photosensitive light source and reflected by the texture to be in a state of sensing and generating a detection electrical signal, and allowing at least one group of image sensors that can receive the first light except the first group of image sensors to be in a state of not sensing and not generating a detection electrical signal.

In the following, the texture recognition device and the operation method of the texture recognition device provided by at least one embodiment of the present disclosure are described in detail with reference to the figures.

Figure 3A:
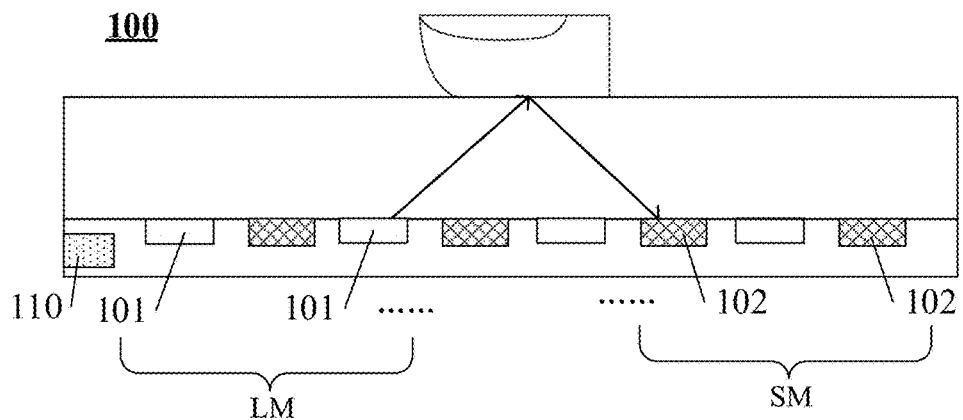
FIG. 3A is a cross-sectional schematic diagram of a texture recognition device provided by at least one embodiment of the present disclosure.
Figure 3B:
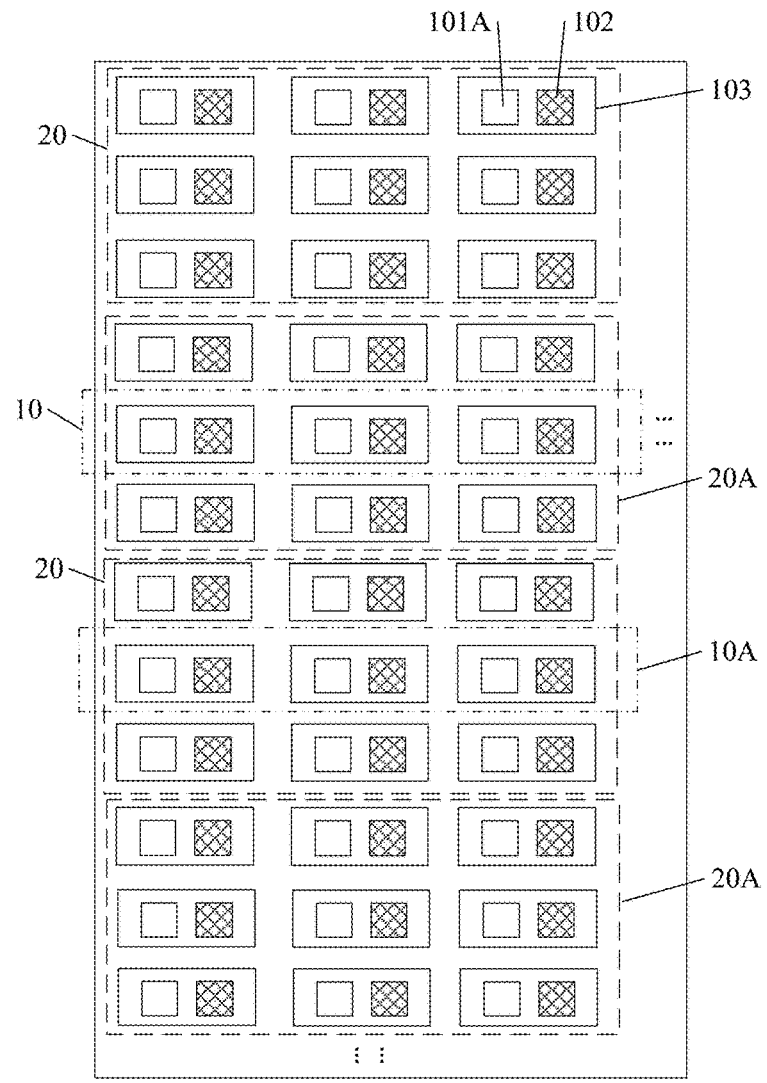
FIG. 3B is a plane schematic diagram of a light source array and an image sensor array in a texture recognition device provided by at least one embodiment of the present disclosure.

FIG. 3A is a cross-sectional schematic diagram of a texture recognition device 100 provided by at least one embodiment of the present disclosure; FIG. 3B is a plane schematic diagram of a light source array and an image sensor array in the texture recognition device 100.

As illustrated in FIG. 3A, the texture recognition device 100 includes a light source array LM and an image sensor array SM, and the light source array LM includes a plurality of light sources 101 that are arranged in an array in a predetermined region. The image sensor array SM includes a plurality of groups of image sensors, each group of the plurality of groups of image sensors includes a plurality of image sensors 102, and for example, the image sensor array SM includes a large number of image sensors which are divided into the plurality of groups of image sensors. The plurality of image sensors 102 included in each group of the plurality of groups of image sensors are arranged in an array within a predetermined region, for example, to form a sub-array of the image sensor array SM, and for example, the image sensor array SM includes a plurality of sub-arrays. The image sensor array SM is configured to receive light emitted from the light source array LM and reflected to the image sensor array SM by a texture for a texture collection.

For example, when an operator with a texture, such as a finger, touches a touch surface of the texture recognition device 100, light emitted by the light source 101 can be reflected by the operator to reach the image sensors 102, and the image sensors 102 can collect the texture image of the operator. For example, the operator with the texture may be a hand, and in this case, the texture recognized by the image sensors 121 is a skin texture, such as a fingerprint, a palm print, etc. In addition, the operator with the texture may also be a non-living body with a certain texture, such as objects with a certain texture made of materials such as resin, and so on, and no specific limitation is imposed to this in embodiments of the present disclosure.

As illustrated in FIG. 3B, the plurality of groups of image sensors include a first group of image sensors 20, and the first group of image sensors 20 is any one group of the plurality of groups of image sensors, that is, the group of image sensors as the current described objects. In this case, the operation method of the texture recognition device 100 comprises: in a first period, allowing the light source array LM to operate to provide a first line light source 10 (an example in which the first line light source serves as the first photosensitive light source), in which, for example, a plurality of light sources 101 in the light source array LM are lighted to form the first photosensitive light source, for example, the first line light source 10; allowing the first group of image sensors 20 that can receive first light emitted by the first line light source 10 and reflected by the texture to be in a state of sensing and generating a detection electrical signal, which means that the inside of each image sensor of the first group of image sensors 20 is photosensitive to generate the electrical signal for the texture collection; and allowing at least one group of image sensors that can receive the first light except the first group of image sensors to be in a state of not sensing and not generating a detection electrical signal, for example, allowing a second group of image sensors 20A arranged between the first group of image sensors 20 to be in the state of not sensing and not generating the detection electrical signal, which means that the inside of each image sensor of the image sensors 20A is not photosensitive and does not generates any electrical signal, and is in a non-operating state. Therefore, when the first line light source 10 is lighted in the first period, the electrical signals generated by the first group of image sensors 20 can be used to form a first frame texture image. For example, the first period corresponds to one detection period.

In the above embodiment, when the first line light source 10 is lighted, the first group of image sensors 20 located in a region where effective texture images can be formed in the image sensor array SM can be photosensitive to generate detection electrical signals, while the second group of image sensors 20A located in an invalid highlight region cannot be photosensitive and cannot generate the electrical signals, and thus the second group of image sensors 20A cannot accumulate charges that may generate a residual image, and therefore when other light sources are lighted after the first period to allow the second group of image sensors 20A to perform an effective texture collection, the second group of image sensors 20A are not be affected by the residual image that may be generated when collecting the first frame texture image.

For example, in some embodiments, the operation method of the texture recognition device 100 further comprises: in a second period different from the first period, allowing the light source array LM to operate to provide a second photosensitive light source, for example, a second line light source 10A, and in which, for example, a plurality of light sources 101, except the plurality of light sources 101 used for forming the first line light source 10, in the light source array LM are lighted to form the second line light source 10A, so that the second line light source 10A does not overlaps with the first line light source 10; allowing the second group of image sensors 20A that can receive second light emitted by the second line light source 10A and reflected by the texture to be in a state of sensing and generating a detection electrical signal, and allowing at least one group of image sensors that can receive the second light except the second group of image sensors to be in a state of not sensing and not generating a detection electrical signal, for example, allowing the first group of image sensors 20 to be in the state of not sensing and not generating a detection electrical signal. Therefore, when the second line light source 10A is lighted in the second period, electrical signals generated by the second group of image sensors 20A can be used to form the second frame texture image. For example, the second period corresponds to another detection period after the first period.

In the above embodiment, because the first group of image sensors 20 and the second group of image sensors 20A operate independently to collect different frames of the texture image, the second frame of the texture image is not affected by the residual image, and thus the second frame of the texture image have higher definition and accuracy. For example, a subsequent image processing, such as cutting and splicing and so on, can be performed on the first frame of the texture image and the second frame of the texture image to form a complete texture image with higher quality, and the texture image after being processed can be used for operations such as subsequent recognition and so on.

It should be noted that in the above-mentioned embodiments, the at least one group of image sensors that are in the state of not sensing and not generating a detection electrical signal mainly include some image sensors that may be interfered by the residual image, such as image sensors located in the invalid highlight region of a previous frame of the texture image. For image sensors that cannot be interfered by the residual image, the embodiments of the present disclosure does not specifically limit the operating state thereof, for example, they may be in the state of sensing and generating a detection electrical signal or in the state of not sensing and not generating a detection electrical signal, and for other groups of image sensors that are in the state of sensing and generating a detection electrical signal, adverse effects may be eliminated by reset operations and the like.

For example, in some embodiments, the texture recognition device 100 is a display device with an under-screen texture recognition function, and accordingly, the display device includes an array of pixel units, that is, a pixel unit array for display operations. Referring to FIG. 3B, the pixel unit array includes a plurality of pixel units 103. For example, each of the plurality of pixel units 103 includes one light emitting component 101A, and further includes a driving circuit (for example, a pixel driving circuit) for driving the light emitting component. For example, the pixel unit array of the display device is used to be implemented as the light source array, and the plurality of light emitting components 101A are implemented to form the plurality of light sources 101. That is, the plurality of light emitting components 101A in the pixel units 103 of the display device are further used as photosensitive light sources for the texture image collection, so that the compactness of the display device can be improved and the arrangement difficulty of respective functional structures can be reduced.

For example, the light emitting components 101A in the pixel units 103 in an entire display region of the display device are controlled to be further used as the photosensitive light sources, thereby realizing full screen texture recognition. For example, the light emitting component 101A is an organic light emitting diode (OLED) or a quantum dot light emitting diode (QLED), etc., and no limitation is imposed to this in the embodiments of the present disclosure. In a case where the light emitting component 101A is an OLED, the texture recognition device is an OLED display device which has self-luminous characteristics, and luminous characteristics of its display pixel units can also be controlled or modulated as needed, thus providing convenience for the texture collection and helping to improve the integration level of the display device.

For example, as illustrated in FIG. 3B, in the case where the light emitting components 101A in the pixel units 103 are further used as the photosensitive light sources, the plurality of pixel units 103 comprise a first group of pixel units 103 that are arranged continuously, and providing the first line light source 10 includes: lighting the first group of pixel units 103 to form the first line light source 10 in the first period.

For example, the first group of pixel units 103 lighted in the first period include a group of pixel units 103 arranged in rows or columns, such as one row of pixel units 103 illustrated in FIG. 3B; in other embodiments, a plurality of adjacent rows of pixel units 103 may be lighted, for example, three rows, four rows, five rows, or the like, or a part of the pixel units 103 in a plurality rows of pixel units 103 are lighted. For example, a ratio L/D of a length L to a width W of the first group of pixel units 103 which are lighted is represented by K, and a value range of K is 9≥K>2, for example, a total number of 3×21 pixel units (such as 3 rows×21 columns or 3 columns×21 rows) are lighted at a same time, and the lighting method of the pixel units in the embodiments of the present disclosure is not limited. For example, in some embodiments, the first group of pixel units 103 lighted in the first period may also serve as a first point light source, such as lighting a total number of 3×3 or 4×4 pixel units at a same time, etc.

For example, in some embodiments, referring to FIG. 3B, one image sensor 102 is provided corresponding to each of the plurality of pixel units 103, that is, the plurality of pixel units are provided in one-to-one correspondence to the image sensors; the plurality of light emitting components 101A and the plurality of image sensors 102 are in a same layer and spaced apart from each other. In this case, the image sensors 102 are placed inside the display device, that is, a fingerprint recognition module and the display device are integrated, and thereby the fingerprint recognition module and the pixel units in the display device can be formed in one production flow, so as to form an integrated product, that is, an texture imaging display device of an in-cell type is formed. In other embodiments, the pixel units and the image sensors are not limited to the one-to-one correspondence arrangement, for example, one image sensor is arranged corresponding to every two pixel units.

Figure 4:
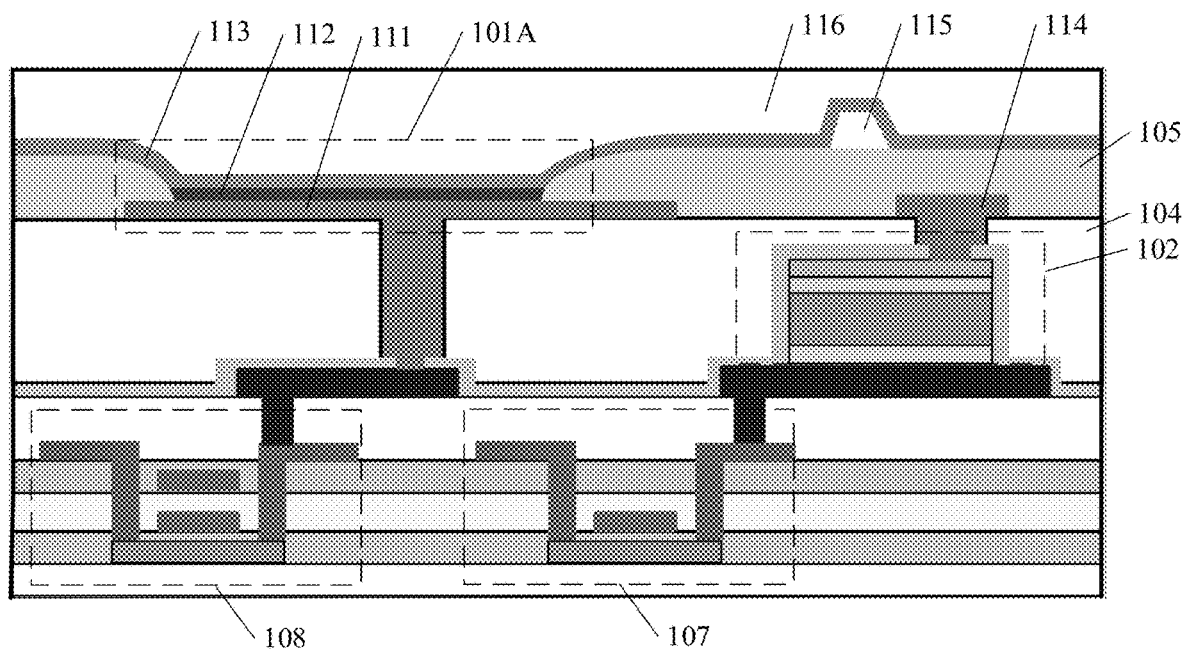
FIG. 4 is a cross-sectional schematic diagram of a display device with an under-screen texture recognition function provided by at least one embodiment of the present disclosure.

For example, FIG. 4 shows a cross-sectional schematic view of a display device with an under-screen texture recognition function provided by at least one embodiment of the present disclosure. In order to illustrate clearly, FIG. 4 shows a schematic cross-sectional view of only one pixel unit of the display device. As illustrated in FIG. 4, each of the plurality of pixel units of the display device includes a light emitting component 101A and an image sensor 102. The light emitting component 101A includes an anode 111, a cathode 113 and a light emitting layer 112 between the anode 111 and the cathode 113. The image sensor 102 includes, for example, a PIN type photodiode, and the photodiode includes a top electrode, a P type semiconductor layer, an intrinsic semiconductor layer and an N type semiconductor layer which are stacked in a top-to-bottom order. For example, the top electrode of the photodiode is electrically connected to a bias line through an electrode 114. The electrode 114 is disposed in a same layer as the anode 111 of the light emitting component 101A, and therefore both the electrode 114 and the anode 111 may be formed by a one patterning process in a preparation process of the display device.

For example, the display device further includes structures such as a planarization layer 104 for planarizing the image sensor 102, a pixel defining layer 105 for defining the plurality of pixel units, a spacer 115 for forming a packaging space, a packaging layer 116, and so on. For example, the planarization layer 104 includes an organic resin material or an inorganic insulating material, and the pixel defining layer 105 includes an organic resin material or an inorganic insulating material.

In a process of fingerprint recognition, besides light emitted by the light source array can be sensed by the image sensor array, the image sensor array may also sense ambient light incident through the finger. Because the image sensors receive light passively and do not actively distinguish the light emitted by the light source array from ambient light, the ambient light may interfere with the fingerprint recognition performed by the image sensors. For example, when the ambient light illuminates directly on the finger, the ambient light can pass through the finger and excite biological tissues in the finger to emit pigment light, and the pigment light may interfere with the fingerprint recognition. It is detected by a test that the pigment light mainly includes light of a wavelength of more than 600 nm.

In this regard, the display device provided by some embodiments of the present disclosure may further include, for example, a color filter layer, the color filter layer is provided at least on the image sensor array, that is, the color filter layer is provided at least at a light input side of the image sensor array, and is configured to filter light of a wavelength larger than 600 nm, so as to prevent the ambient light from interfering with the normal operation of the image sensors. For example, the color filter layer is an additional functional layer in the display device, or is formed using an existing functional layer in the display device.

For example, in some embodiments, the color filter layer is realized by the planarization layer 104 and/or the pixel defining layer 105 described above. In this case, the planarization layer 104 and/or the pixel defining layer 105 may be made of an organic resin material, and a colored dye may be incorporated into the organic resin material, the colored dye can absorb light of a wavelength more than 600 nm, so that the planarization layer 104 and/or the pixel defining layer 105 doped with the colored dye can form a certain filtering effect on the light of a wavelength more than 600 nm. The colored dye includes, for example, bromamine acid derivatives and the like, for example, showing colors such as green, cyan, or the like.

In one example, both the planarization layer 104 and the pixel defining layer 105 include an organic resin material doped with a colored dye, so that the combination of the planarization layer 104 and the pixel defining layer 105 can sufficiently prevent the ambient light from entering the image sensors to interfere with the normal operation of the image sensors, and cannot affect light emitting effect of the light emitting component 101A at the same time, that is, cannot affect the display effect of the display device. For example, colored dyes respectively included in the planarization layer 104 and the pixel defining layer 105 may be same or different; for example, in a case where the colored dyes respectively included in the planarization layer 104 and the pixel defining layer 105 are different, the wavelength ranges of light that the planarization layer 104 and the pixel defining layer 105 can absorb at least partially do not overlap with each other, thereby the planarization layer 104 and the pixel defining layer 105 as a whole can provide a wider absorption wavelength range.

Figure 9A:
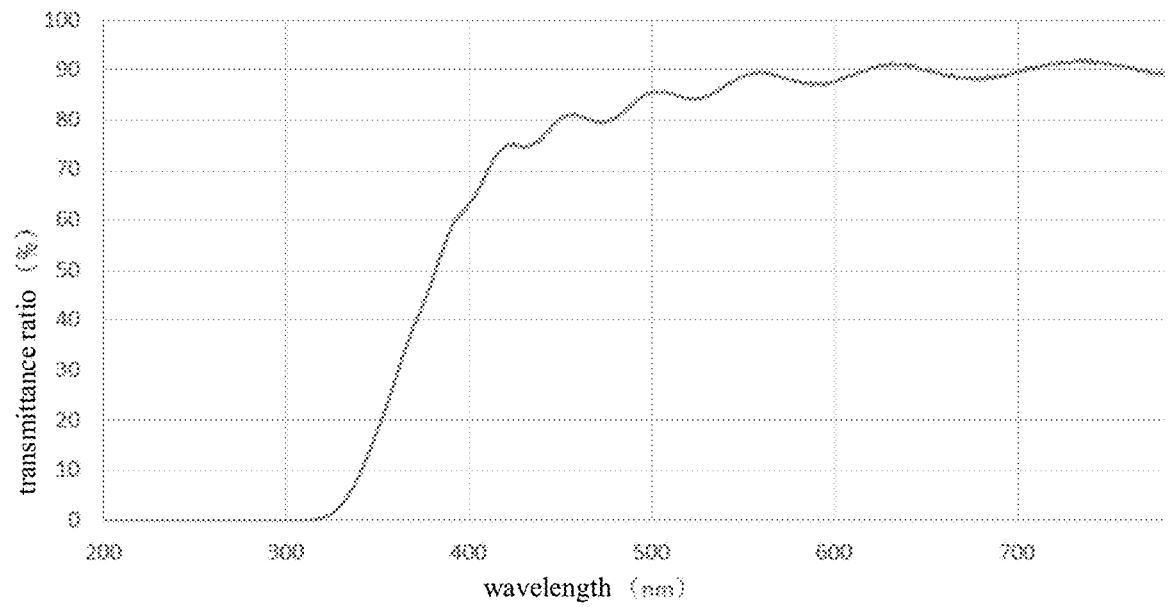
FIG. 9A is a light transmittance ratio diagram of a planarization layer and a pixel defining layer in a texture recognition device.
Figure 9B:
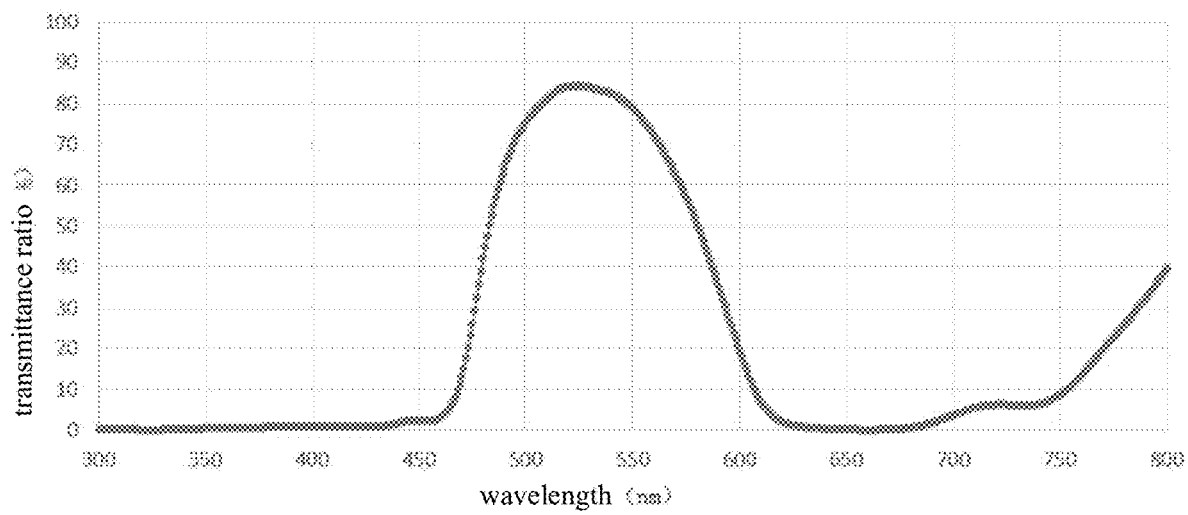
FIG. 9B is a light transmittance ratio diagram of a planarization layer or a pixel defining layer formed as a color filter layer in a texture recognition device provided by at least one embodiment of the present disclosure.

For example, FIG. 9A shows a light transmission spectrum of the planarization layer 104 and the pixel defining layer 105 that are not doped with the colored dyes, and FIG. 9B shows a light transmission spectrum of the planarization layer 104 and the pixel defining layer 105 that are doped with the colored dyes. It can be seen that a transmittance ratio of the planarization layer 104 and a transmittance ratio of the pixel defining layer 105 that are doped with the colored dyes to light of a wavelength more than 600 nm is greatly reduced, that is, an effective filtering effect is formed on light of the wavelength more than 600 nm.

It should be noted that in addition to the pixel unit array, the display device further includes a pixel driving circuit (including a plurality of switch components (for example, a plurality of transistors 108) and capacitors, etc.) that drives the light emitting components of the pixel units of the pixel unit array, signal lines (including gate lines, data lines, detection lines, etc.) that are configured to provide electrical signals (including scan signals, data signals, detection signals, etc.), and a driving circuit (including switch components (for example, transistors 107)) that is connected with the image sensors 102, etc. For example, the transistors 107 connected with the image sensors 102 and the transistors 108 connected with the pixel units are in a same layer, and therefore in the preparation process of the display device, the transistors 107 connected with the image sensors 102 and the transistors 108 connected with the light emitting components of the pixel units can be formed together in a same process, thereby simplifying the manufacturing process, reducing the cost and making the thickness of the display device thinner. For example, in other embodiments, the display device may further include functional structures such as a touch layer, a polarizer layer, a protection cover plate, and the like according to needs, and these functional structures may be bonded to the display device by, for example, optically clear adhesive (OCA). The embodiments of the present disclosure do not specifically limit other structures of the display device.

For example, in some embodiments, each image sensor 102 of the plurality of groups of image sensors 102 comprises a photosensitive component, and therefore allowing the first group of image sensors to be in the state of sensing and generating the detection electrical signal and allowing the at least one group of image sensors except the first group of image sensors to be in the state of not sensing and not generating the detection electrical signal comprise: allowing photosensitive components in the first group of image sensors 20 to be negatively biased, that is, to be under negative bias, and allowing photosensitive components in the at least one group of image sensors except the first group of image sensors to be under non-negative bias. For example, the non-negative bias comprises positive bias or zero bias.

For example, the photosensitive component included in the image sensor 102 may be the photodiode mentioned above. For example, the photodiode is a PN type photodiode or a PIN type photodiode, and a semiconductor material adopted by the photodiode may be silicon, germanium, selenium, gallium arsenide and so on. In some embodiments, according to the connection mode of the photosensitive component in each of the image sensors, only when the photosensitive component is under negative bias, charges can be accumulated inside the photosensitive component to produce electrical signals that can be detected for the fingerprint recognition. When the photosensitive component is under non-negative bias, such as zero bias or positive bias, light-generating carriers generate and recombine quickly inside the photosensitive component, without accumulating charges and thus no residual charge is formed. In particular, when the photosensitive component is under positive bias, a large positive current is generated inside the photosensitive component, and residual carriers in the photosensitive component are released with the large positive current, and the residual image is further eliminated.

For example, in some embodiments, the image sensor array SM includes at least two groups of image sensors, for example, three groups of image sensors, and in a case where the image sensor array includes a third group of image sensors, the operation method of the texture recognition device 100 further comprises: in a third period different from the first period and the second period, allowing the light source array LM to operate to provide a third photosensitive light source, for example, a third line light source, allowing the third group of image sensors that can receive third light emitted by the third line light source and reflected by the texture to be in a state of sensing and generating a detection electrical signal, and allowing at least one group of image sensors that can receive the third light except the third group of image sensors to be in a state of not sensing and not generating a detection electrical signal. The third line light source does not overlap with the first line light source, and the third line light source does not overlap with the second line light source. For example, the third period corresponds to another detection period after the first period and the second period.

Figure 5:
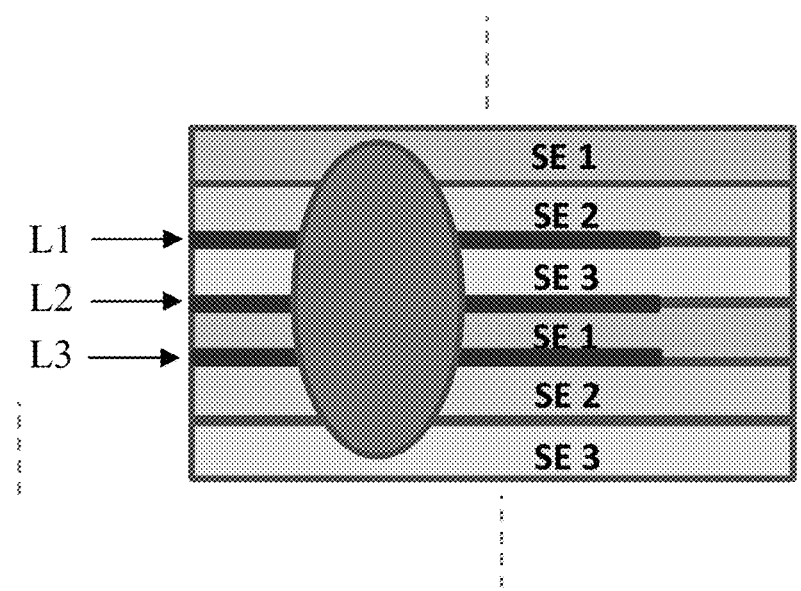
FIG. 5 is a schematic diagram showing texture recognition performed by a texture recognition device provided by at least one embodiment of the present disclosure.
Figure 6A:
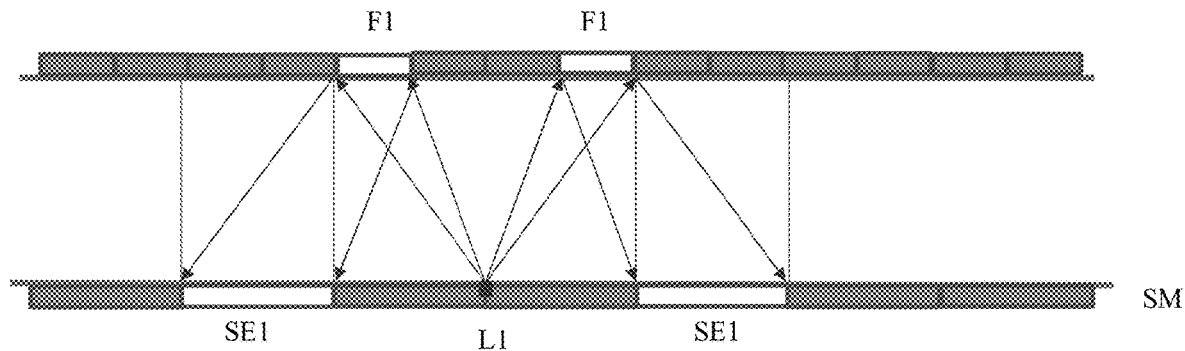
FIG. 6A-FIG. 6C are principle diagrams of texture recognition performed by a texture recognition device provided by at least one embodiment of the present disclosure.

For example, as illustrated in FIG. 5, the image sensor array SM includes three groups of image sensors SE1~SE3, each group of the three groups of image sensors includes a plurality of rows, each of the plurality of rows includes a plurality of image sensors (not specifically illustrated), and the rows of the three groups of image sensors SE1~SE3 are arranged alternately and periodically. As illustrated in FIG. 5, when a touch surface of the texture recognition device 100 is pressed by a fingerprint, in the first period, a first line light source L1 is lighted, and the first group of image sensors SE1 that can effectively perform the texture collection are negatively biased, so that charges are accumulated inside the first group of image sensors SE1 and electrical signals are generated, while the second group of image sensors SE2 and the third group of image sensors SE3 are under zero bias or positive bias, and thus electrical signals cannot be generated inside the second group of image sensors SE2 and the third group of image sensors SE3. Photosensitive light paths of the photosensitive components of the first group of image sensors SE1 are illustrated in FIG. 6A. Thus, when the first line light source L1 is lighted, the first group of image sensors SE1 can obtain a first frame of the texture image corresponding to a part F1 of the fingerprint. For example, as illustrated in FIG. 5, positions of the line light sources L1-L3 that are lighted are located at connection positions of divided portions (for example, minimum portions) of the groups of image sensors SE1-SE3, etc., such as at positions between the divided portions (for example, minimum portions) of the groups of image sensors. Here, for example, the line light source that is lighted extends in a same direction as an extension direction of the rows of the image sensor array.

Figure 6B:
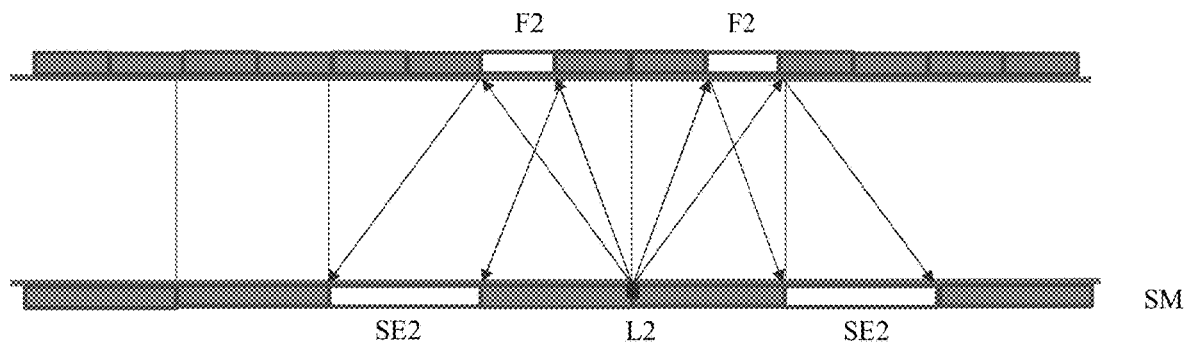

For example, in the second period, a second line L2 is lighted, and the second group of image sensors SE2 are negatively biased, thereby effectively performing the texture collection, while the first group of image sensors SE1 and the third group of image sensors SE3 are under zero bias or positive bias, and thus electrical signals cannot be generated inside the first group of image sensors SE1 and the third group of image sensors SE3. Photosensitive light paths of the photosensitive components of the second group of image sensors SE2 are illustrated in FIG. 6B. Thus, when the second line light source L2 is lighted, the second group of image sensors SE2 can obtain a second frame of the texture image corresponding to a part F2 of the fingerprint.

Figure 6C:
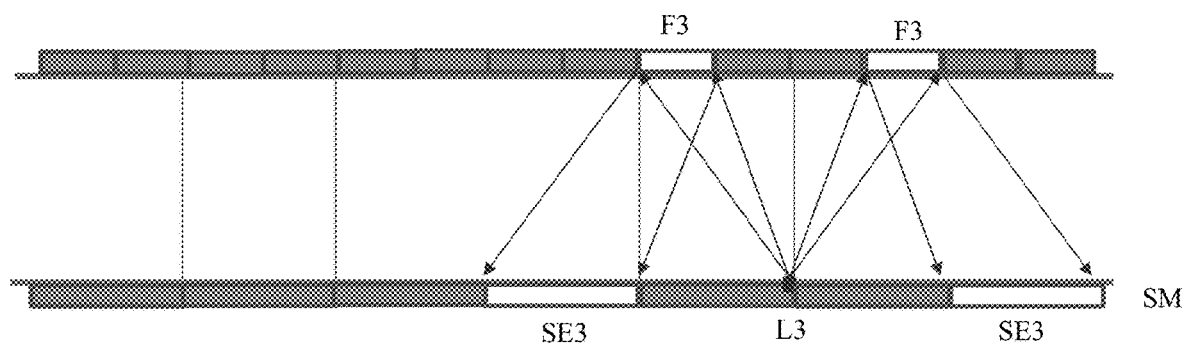

For example, in the third period, the third line light source L3 is lighted, and the third group of image sensors SE3 are negatively biased, thereby effectively performing the texture collection, and the first group of image sensors SE1 and the second group of image sensors SE2 are under zero bias or positive bias, and thus electrical signals cannot be generated inside the first group of image sensors SE1 and the second group of image sensors SE2. Photosensitive paths of the photosensitive components of the third group of image sensors SE3 are illustrated in FIG. 6C. Therefore, when the third line light source L3 is lighted, the third group of image sensors SE3 can obtain a third frame of the texture image corresponding to a part F3 of the fingerprint.

Figure 7:
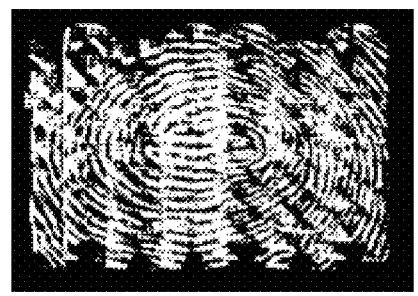
FIG. 7 is a texture image obtained by a texture recognition device provided by at least one embodiment of the present disclosure.

For example, the first frame of the texture image, the second frame of the texture image and the third frame of the texture image that are respectively obtained by the first group of image sensors, the second group of image sensors and the third group of image sensors can be spliced together to form a complete texture image, as illustrated in FIG. 7.

Figure 8A:
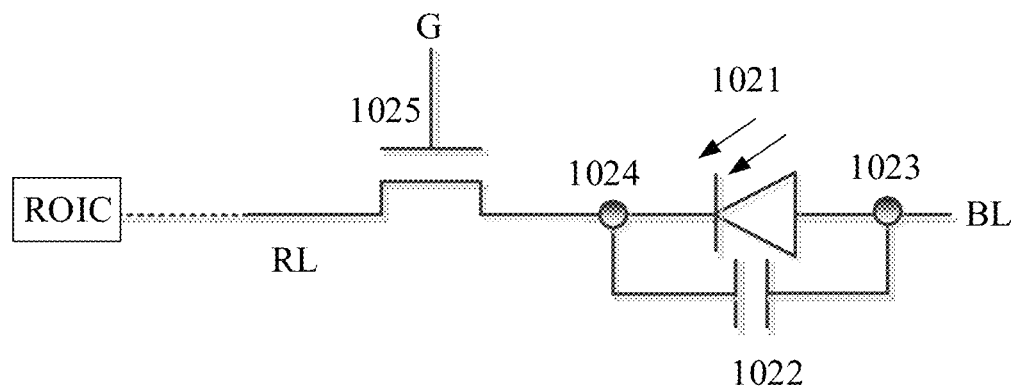
FIG. 8A is a schematic diagram of a structure and a connection relationship of an image sensor in a texture recognition device provided by at least one embodiment of the present disclosure.

For example, FIG. 8A shows a structure and a circuit connection relationship of an exemplary image sensor. As illustrated in FIG. 8A, each of the image sensors 102 includes a photosensitive component 1021 and a switch transistor 1025. In some examples, the image sensor 102 also includes a capacitor 1022. A first terminal (anode terminal) 1023 of the photosensitive component 1021 is connected with a bias line BL, a second terminal (cathode terminal) of the photosensitive component 1021 1024 is connected with a first electrode of the switch transistor 1025, a second electrode of the switch transistor 1025 is connected with a signal readout line RL, a control electrode G of the switch transistor 1025 is connected with a scanning signal used for the image sensor array, and the signal readout line RL is connected with a ROIC. A first electrode of the capacitor 1022 is electrically connected to the first terminal 1023 of the photosensitive component 1021, and a second electrode of the capacitor 1022 is electrically connected with the second terminal 1024 of the photosensitive component 1021.

The operating process of the above exemplary image sensor including the capacitor 1022 includes: during a reset stage, inputting a scanning signal to the control electrode G to allow the switch transistor 1025 to be turned on, and the ROIC writes a reset signal in the capacitor 1022 through the switch transistor 1025 to reset the capacitor 1022 and reset the photosensitive component 1021; in a photosensitive stage, allowing the switch transistor 1025 to be turned off and allowing the photosensitive component 1021 to be under a negative bias state, and the photosensitive component 1021 generates photogenic carriers under irradiation of reflected light and charges the capacitor 1022, so that the capacitor 1022 generates and stores electrical signals; and in a detection stage, allowing the switch transistor 1025 to be turned on, and the ROIC reads the electrical signals stored by the capacitor 1022 through the switch transistor 1025, and then the texture image is formed.

Figure 8B:
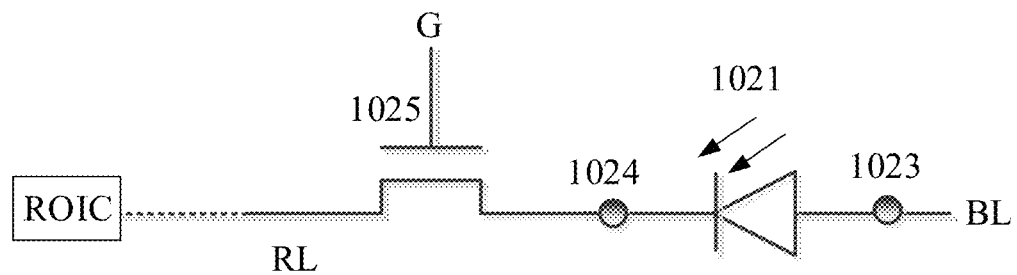
FIG. 8B is a schematic diagram of a structure and a connection relationship of another image sensor in a texture recognition device provided by at least one embodiment of the present disclosure.

FIG. 8B shows a structure and a circuit connection relationship of another exemplary image sensor which does not include a capacitor. The operating process of the exemplary image sensor without the capacitor includes: in the reset stage, inputting the scanning signal to the control electrode G to allow the switch transistor 1025 to be turned on, and the ROIC writes the reset signal in the cathode of the photosensitive component 1021 through the switch transistor 1025, so that the photosensitive component 1021 is reset; in the photosensitive stage, allowing the switch transistor 1025 to be turned off and allowing the photosensitive component 1021 to be under the negative bias state, and the photosensitive component 1021 generates photogenic carriers to generate a photogenic leakage current under the irradiation of the reflected light; and in the detection stage, allowing the switch transistor 1025 to be turned on, and the ROIC reads electrical signals corresponding to the photogenic leakage current through the switch transistor 1025, and then the texture image is formed.

It should be noted that the structure and the operating mode of the image sensor are not limited to the above examples, and no specific limitation is imposed to the structure and the operating mode of the image sensor in the embodiments of the present disclosure.

Figure 8C:
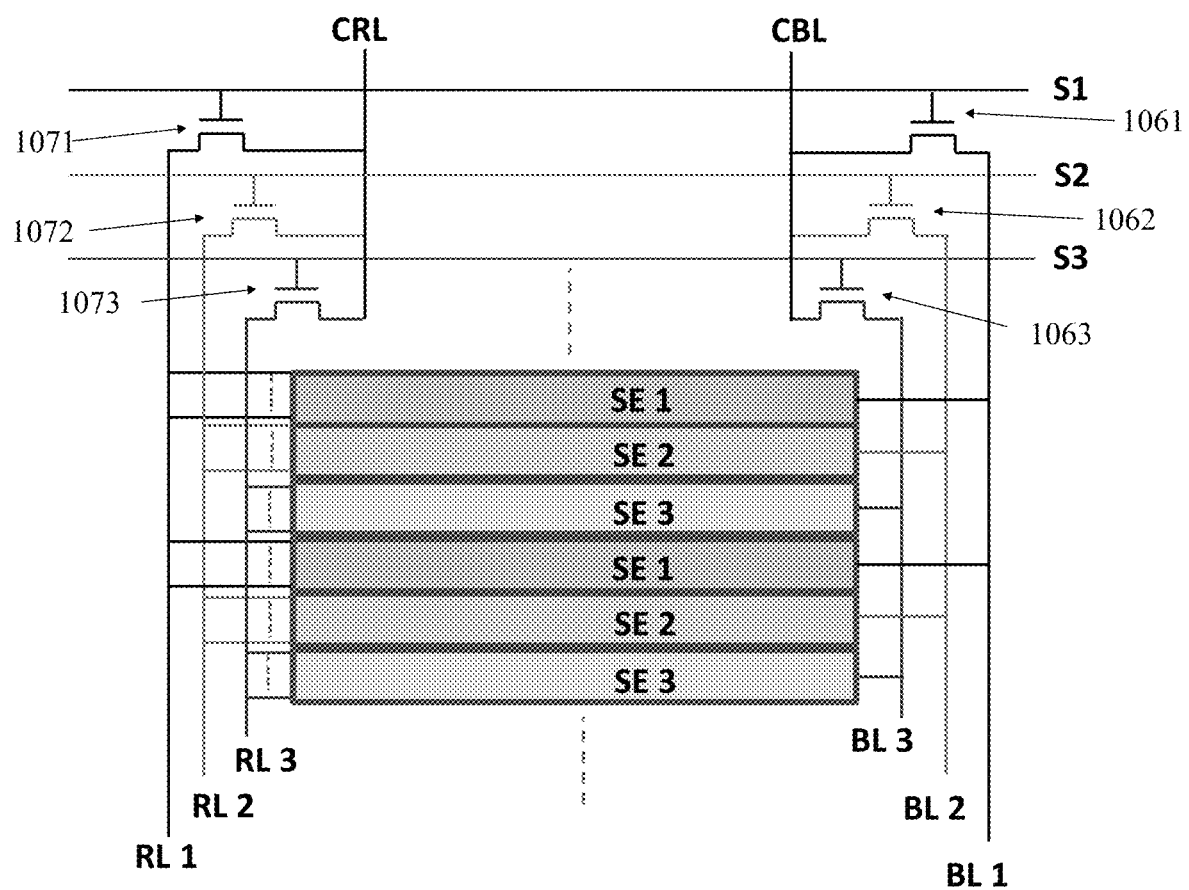
FIG. 8C and FIG. 8D are schematic diagrams of connection relationships of a plurality of groups of image sensors in a texture recognition device provided by at least one embodiment of the present disclosure.

For example, in some embodiments, as illustrated in FIG. 8C, a first terminal of each photosensitive component of a same group of image sensors is connected with a same bias line BL, photosensitive components of different groups of image sensors are respectively connected with different bias lines BL. For example, the photosensitive components in the first group of image sensors SE1 are connected to a first bias line BL1, the photosensitive components in the second group of image sensors SE2 are connected to a second bias line BL2, and the photosensitive components in the third group of image sensors SE3 are connected to a third bias line BL3. Similarly, in FIG. 8C, the first group of image sensors SE1 includes a plurality of divided portions in different rows (two divided portions are illustrated in the figure), and adjacent divided portions are separated by other groups of image sensors (here including a divided portion of the second group of image sensors SE2, and a divided portion of the third group of image sensors SE3). In some embodiments, the bias lines BL1, BL2 and BL3 are connected with, for example, a power management circuit which applies bias signals (that is, bias voltages) respectively to the bias lines BL1, BL2 and BL3 according to the control signal, so that the corresponding bias lines BL1, BL2 and BL3 are in any one of a group consisting of a negative bias state, a positive bias state and a zero bias state. In some other embodiments, as illustrated in FIG. 8C, the different bias lines BL1, BL2 and BL3 corresponding to different groups of image sensors are respectively connected with a bias bus CBL through, for example, switch components respectively corresponding to the different bias lines BL1, BL2 and BL3, and the states of the bias lines BL1, BL2 and BL3 are respectively controlled by controlling the turning on and turning off of the first switch components respectively corresponding to the bias lines BL1, BL2 and BL3 and by a bias signal which is applied to the bias bus CBL by the power management circuit. Therefore, the photosensitive components of the plurality of groups of image sensors can be independently controlled, that is, they can be independently negatively biased, zero biased or positively biased, so as to independently perform the process of being photosensitive and generating the detection electrical signals, and no influence of the residual image is generated among them.

Figure 8D:
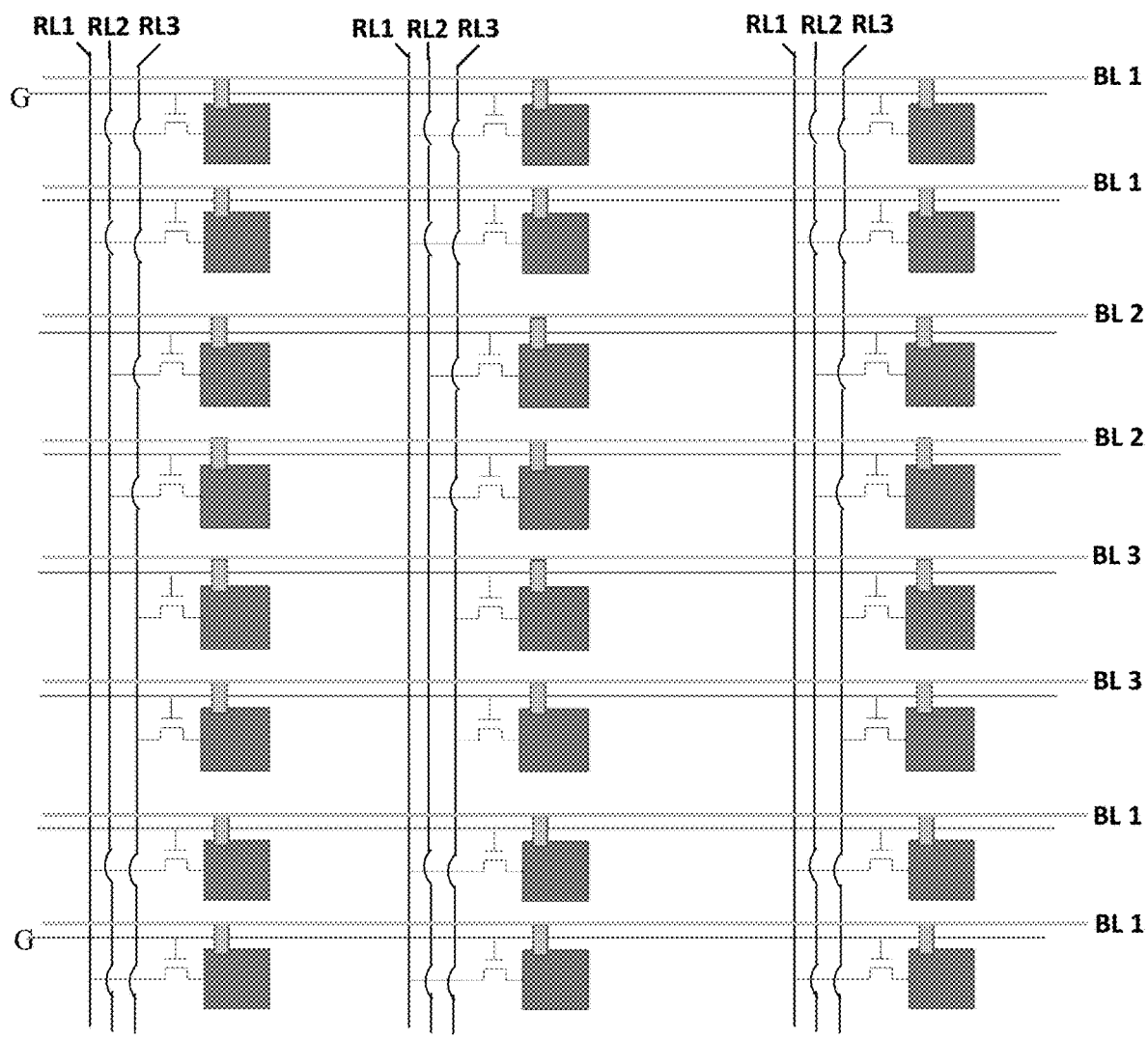

Referring to FIG. 8D, each divided portion of the first group of image sensors SE1 includes two rows of image sensors, and among the two rows of image sensors, a first row (an upper row) of image sensors are connected with a same scanning line G and connected with a same bias line BL1, a second row (a lower row) of image sensors are connected with another scanning line G and connected with a same bias line BL1. Each divided portion of the second group of image sensors SE2 and each divided portion of the third group of image sensors SE3 are arranged similarly to that of the first group of image sensors SE1. In other embodiments, each divided portion of each group of image sensors may also include one row of image sensors, or three or more rows of image sensors.

In this case, the operation method of the texture recognition device 100 includes: in the first period, turning on the first switch component 1061 connected with the first bias line BL1 which is connected with the first group of image sensors SE1, so as to apply a negative bias voltage to the photosensitive components of the first group of image sensors SE1, accordingly, the second bias line BL2 and the third bias line BL3 are in a suspended state and thus in the state of zero bias; in the second period, turning on the second switch component 1062 connected with the second bias line BL2 which is connected with the second group of image sensors SE2, so as to apply a negative bias voltage to the photosensitive components of the second group of image sensors SE2, accordingly, the first bias line BL2 and the third bias line BL3 are in the suspended state and thus in the state of zero bias; and in the third period, turning on the third switch component 1063 connected with the third bias line BL3 which is connected with the third group of image sensors SE3, so as to apply a negative bias voltage to the photosensitive components of the third group of image sensors SE1, accordingly, the first bias line BL1 and the second bias line BL2 are in the suspended state and thus in the state of zero bias. Thus, the photosensitive components of the first group of image sensors SE1, the photosensitive components of the second group of image sensors SE2 and the photosensitive components of the third group of image sensors SE3 are successively photosensitive to generate electrical signals.

For example, in some embodiments, as illustrated in FIG. 8C and FIG. 8D, the image sensor array SM includes a plurality of columns (three columns is illustrated in the figure), each group of the plurality of groups of image sensors comprises image sensors in the plurality of columns, and for a same column of the plurality of columns, a same group of the plurality of groups of image sensors are connected with a same signal readout line (RL), different groups of image sensors are respectively connected with different signal readout lines. For example, the first group of image sensors SE1 are connected with a first signal readout line RL1, the second group of image sensors SE2 are connected with a second signal readout line RL2, and the third group of image sensors SE2 is connected with the third signal readout line RL3. Different signal reading lines RL1, RL2 and RL3 are connected with a signal readout bus CRL respectively by the corresponding second switch components 1071~1073. Thus, the plurality of groups of image sensors can independently transmit electrical signals to the readout integrated circuit (ROIC) which is connected with the signal readout bus CRL for the texture recognition.

In this case, the operation method of the texture recognition device 100 further includes: in the first period, turning on the second switch component 1071 connected with the first signal readout line RL1 which is connected with the first group of image sensors SE1, so that electrical signals generated by the first group of image sensors SE1 can be transmitted to the ROIC; in the second period, turning on the second switch component 1072 connected with the second signal readout line RL2 which is connected with the second group of image sensors SE2, so that electrical signals generated by the second group of image sensors SE2 can be transmitted to the ROIC; and in the third period, turning on the third switch component 1073 connected with the third signal readout line RL3 which is connected with the third group of image sensors SE3, so that electrical signals generated by the third group of image sensors SE3 can be transmitted to the ROIC. Thus, the ROIC can acquire electrical signals corresponding to different parts of the fingerprint in different periods and form a complete texture image.

For example, in some embodiments, the first switch component is a first switch transistor, the second switch component is a second switch transistor, and a gate electrode (control electrode) of the first switch transistor and a gate electrode (control electrode) of the second switch transistor, in which the first switch transistor and the second switch transistor are connected with a same group of the plurality of groups of image sensors, are connected with a same selection line. The selection line is used to apply a selection signal for selecting which group of image sensors to operate to collect a frame of the texture image. For example, the first switch component 1061 and the second switch component 1071 that are connected with the first group of image sensors SE1 are connected with a first selection line S1. When the selection signal is applied to the first selection line S1, the first switch component 1061 and the second switch component 1071 are turned on, and the first group of image sensors SE1 are selected for the operation of collecting the texture image. The first switch component 1062 and the second switch component 1072 that are connected with the second group of image sensors SE2 are connected with a second selection line S2. When the selection signal is applied to the second selection line S2, the first switch component 1062 and the second switch component 1072 are turned on, and the second group of image sensors SE2 are selected for the operation of collecting the texture image. The first switch component 1063 and the second switch component 1073 that are connected with the third group of image sensors SE3 are connected with a third selection line S3. When the selection signal is applied to the third selection line S3, the first switch component 1063 and the second switch component 1073 are turned on, and the third group of image sensors SE3 are selected for the operation of collecting the texture image. Thus, the first switch component and the second switch component that are connected with a same group of image sensors can be turned on or turned off simultaneously.

Figure 8E:
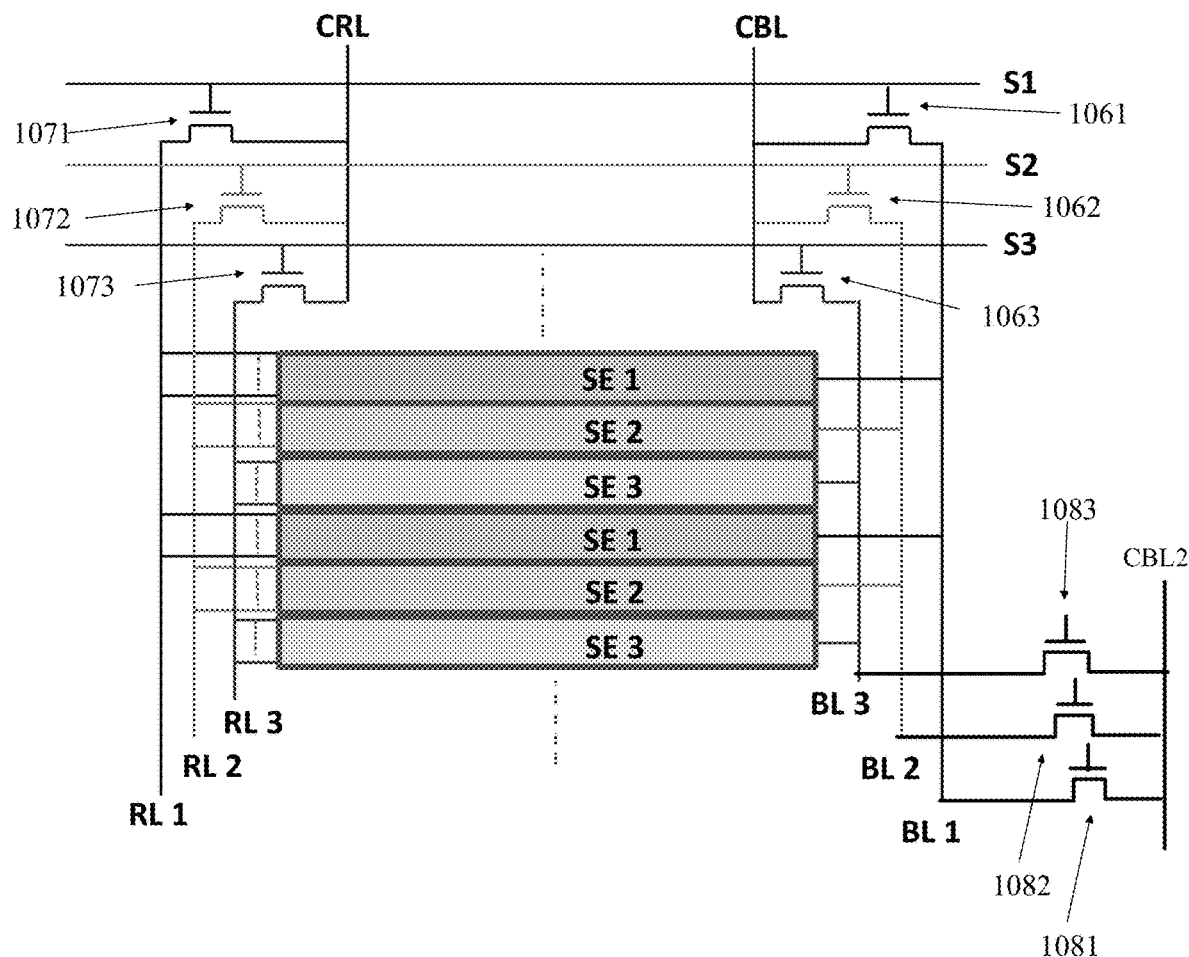
FIG. 8E is another schematic diagram of connection relationships of a plurality of groups of image sensors in a texture recognition device provided by at least one embodiment of the present disclosure.

For example, in a solution that the photosensitive components in one group of image sensors are under negative bias while the photosensitive components in other at least one group of image sensors are under positive bias, on the basis of the above structure, as illustrated in FIG. 8E, the first terminals of the photosensitive components in each group of image sensors are connected with a second bias bus CBL2 respectively through a third switch component 1081, a third switch component 1082 and a third switch component 1083, and thus the second bias bus CBL2 can optionally apply a positive bias to a group of image sensors.

The operation method of the texture recognition device provided by at least one embodiment of the present disclosure can allow each group of the plurality of groups of image sensors of the image sensor array to operate independently, the line light source is lighted in the time-sharing manner by adopting a certain rule, and one group of image sensors that correspond to the line light source are in the state of sensing and generating a detection electrical signal, while other at least one group of sensors are in the state of not sensing and not generating a detection electrical signal, so that no interference of residual image is generated among the texture images respectively obtained by the plurality of groups of image sensors, and a clear and accurate texture image is collected in a relatively short period of time. In addition, whole recognition of a large texture can be realized by the time-sharing manner.

At least one embodiment of the present disclosure further provides a texture recognition device, referring to FIG. 3A and FIG. 3B, the texture recognition device 100 includes a light source array LM and an image sensor array SM, and the light source array LM includes a plurality of light sources 101 that are arranged in an array in a predetermined region. The image sensor array SM includes a plurality of groups of image sensors, each group of the plurality of groups of image sensors includes a plurality of image sensors 102. The plurality of image sensors 102 included in each group of the plurality of groups of image sensors are arranged in an array within a predetermined region, for example, to form a sub-array of the image sensor array SM. The image sensor array SM is configured to receive light emitted from the light source array LM and reflected to the image sensor array SM by a texture for a texture collection.

For example, the image sensor array SM includes a plurality of groups of image sensors, for example, at least two groups of image sensors. The image sensor array (a circuit structure of the image sensor array) is configured to allow (for example, in a certain period) one group of the plurality of groups of image sensors to be in a state of sensing and generating a detection electrical signal, while allowing at least one group of image sensors except the one group of the plurality of groups of image sensors to be in a state of not sensing and not generating a detection electrical signal.

For example, the plurality of groups of image sensors of the image sensor array SM include a first group of image sensors 20, and the image sensor array SM is configured to allow the first group of image sensors 20 to be in the state of sensing and generating a detection electrical signal, while allowing at least one group of image sensors (for example, a second group of image sensors 20A) except the first group of image sensors to be in the state of not sensing and not generating a detection electrical signal.

In this regard, in an operation process of texture recognition, photosensitive components in the first group of image sensors 20 are negatively biased, and photosensitive components in the at least one group of image sensors (for example, the second group of image sensors 20A) except the first group of image sensors are non-negatively biased, such as zero biased or positively biased.

For example, the light source array LM further includes the second group of image sensors 20A, and the light source array LM is further configured to allow the second group of image sensors 20A to be in a state of sensing and generating a detection electrical signal, while allowing at least one group of image sensors (for example, the first group of image sensors 20) except the second group of image sensors to be in a state of not sensing and not generating a detection electrical signal. For example, in the operation process of texture recognition, the photosensitive components in the second group of image sensors 20A are negatively biased, and the photosensitive components in the at least one group of image sensors (for example, the first group of image sensors 20) except the second group of image sensors are non-negatively biased, such as zero biased or positively biased.

For example, in some embodiments, the texture recognition device 100 further comprising a controller 110, and operating states of the plurality of groups of image sensors are controlled by the controller 110.

For example, in some embodiments, referring to FIG. 3A and FIG. 3B, the controller 110 is configured to, in a first period, control the light source array LM to operate to provide a first line light source 10, allow the first group of image sensors 20 that can receive first light emitted by the first line light source and reflected by the texture to be in the state of sensing and generating a detection electrical signal, and allow at least one group of image sensors (for example, the second group of image sensors 20A) that can receive the first light except the first group of image sensors 20 to be in the state of not sensing and not generating a detection electrical signal; and the controller 110 is also configured to, in a second period, control the light source array LM to operate to provide a second line light source 10A, allow the second group of image sensors 20A that can receive second light emitted by the second line light source 10A and reflected by the texture to be in the state of sensing and generating a detection electrical signal, and allow at least one group of image sensors (for example, the first group of image sensors 20) that can receive the second light except the second group of image sensors 20A to be in the state of not sensing and not generating a detection electrical signal. The first line light source 10 does not overlap with the second line light source 10A.

For example, in some embodiments, the texture recognition device 100 is a display device with an under-screen texture recognition function, and accordingly, the display device includes an array of pixel units, as illustrated in FIG. 3B, the pixel unit array includes a plurality of pixel units 103. For example, each of the plurality of pixel units 103 includes one light emitting component 101A. For example, the pixel unit array of the display device is used to be implemented as the light source array, and the plurality of light emitting components 101A are implemented as the plurality of light sources 101. That is, the plurality of light emitting components 101A in the pixel units of the display device are further used as photosensitive light sources. The plurality of pixel units 103 comprise a first group of pixel units that are arranged continuously.

In this case, the controller 110 is further configured to, in the first period, light the first group of pixel units to form a first line light source 10. For example, the first group of pixel units 103 lighted in the first period include a group of pixel units 103 arranged in rows or columns. Specific mode in which the plurality of pixel units 103 are lighted can be referred to the above embodiments and are not repeated here.

For example, the display device may also include other necessary structures, the specific structures and descriptions of the display device can be referred to the above embodiments and are not repeated here.

For example, in some embodiments, the image sensor array SM includes three groups of image sensors, that is, on the basis of the above embodiment, the image sensor array SM further includes a third group of image sensors, in this case, the controller 110 is further configured to, in a third period different from the first period and the second period, allow the light source array LM to operate to provide a third line light source, allow the third group of image sensors that can receive third light emitted by the third line light source and reflected by the texture to be in the state of sensing and generating a detection electrical signal, and allow at least one group of image sensors that can receive the third light except the third group of image sensors to be in the state of not sensing and not generating a detection electrical signal, for example, both the first group of image sensors and the second group of image sensors are in the state of not sensing and not generating a detection electrical signal. The third line light source does not overlap with the first line light source, and the third line light source does not overlap with the second line light source.

For example, referring to FIG. 8C and FIG. 8D, a first terminal of each photosensitive component of a same group of the plurality of groups of image sensors is connected with a same bias line, photosensitive components of different groups of image sensors are respectively connected with different bias lines, and different bias lines are connected to a bias bus respectively through first switch components. In this case, the controller 110 is configured to turn on a first switch component connected with the bias line which is connected with the first group of image sensors in the first period, turn on a first switch component connected with the bias line which is connected with the second group of image sensors in the second period, and turn on a first switch component connected with the bias line which is connected with the third group of image sensors in the third period. Thus, the first group of image sensors, the second group of image sensors, and the third group of image sensors can successively be photosensitive and generate the detection electrical signals.

For example, the image sensor array includes a plurality of columns. For a same column of the plurality of columns, a same group of the plurality of groups of image sensors are connected with a same signal readout line, and different groups of image sensors are respectively connected with different signal readout lines, and different signal readout lines are connected to a signal readout bus respectively through second switch components. In this case, the controller 110 is further configured to turn on a second switch component connected with the signal readout line which is connected with the first group of image sensors in the first period, turn on a second switch component connected with the signal readout line which is connected with the second group of image sensors in the second period, and turn on a second switch component connected with the signal readout line which is connected with the third group of image sensors in the third period. Thus, the detection electrical signals generated by the first group of image sensors, the second group of image sensors and the third group of image sensors can be successively output.

The circuit connection relationship of each group of image sensors can be referred to the above embodiments and is not repeated here.

No limitation is imposed to the type of controller 100 in the embodiments of the present disclosure. For example, the controller 110 may be a variety of integrated circuit chips with a processing function, and may have various computing architectures, such as a complex instruction set computer (CISC) structure, a reduced instruction set computer (RISC) structure, or a structure that implements multiple instruction set combinations. In some embodiments, the controller 110 may be a microprocessor, such as an X86 processor or an ARM processor, or may be a digital processor (DSP), etc.

For example, in some embodiments, controller 110 may further include a memory for storing control programs for lighting the plurality of line light sources (or the plurality of pixel units) in the time-sharing manner and control programs for turning on the plurality of groups of image sensors in the time-sharing manner, and the like. For example, the memory may be any form of storage medium, such as a volatile memory or a non-volatile memory, such as a semiconductor memory or a magnetic medium memory, and so on, which are not limited in the embodiments of the present disclosure.

The texture recognition device provided by at least one embodiment of the present disclosure includes a plurality of groups of image sensors that can operate independently, the line light source is lighted in the time-sharing manner by the controller adopting a certain rule, and one group of image sensors that correspond to the line light source are in the state of sensing, and generating a detection electrical signal, while other at least one group of sensors are in the state of not sensing and not generating a detection electrical signal, so that no interference of residual image is generated among the texture images respectively obtained by the plurality of groups of image sensors, and a clear and accurate texture image is collected in a relatively short period of time. In addition, whole recognition of a large texture can be realized in the time-sharing manner.

The following should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, embodiments of the present disclosure and the features in the embodiments may be mutually combined to obtain new embodiments.

What have been described above are only specific implementations of the present disclosure, the protection scope of the present disclosure is not limited thereto. The protection scope of the present disclosure should be based on the protection scope of the claims.

What is claimed is:

1. An operation method of a texture recognition device, wherein the texture recognition device comprises:

a light source array comprising a plurality of light;

an image sensor array comprising a plurality of groups of image sensors, wherein each group of the plurality of groups of image sensors comprises a plurality of image sensors, the image sensor array is configured to receive light emitted from the light source array and reflected to the image sensor array by a texture for a texture collection, and the plurality of groups of image sensors comprise a first group of image sensors; and the operation method comprises:

in a first period, allowing the light source array to operate to provide a first photosensitive light source, allowing the first group of image sensors, which is capable of receiving first light emitted by the first photosensitive light source and reflected by the texture, to be in a state of sensing and generating a detection electrical signal, and allowing at least one group of image sensors that is capable of receiving the first light except the first group of image sensors to be in a state of not sensing and not generating a detection electrical signal, wherein the plurality of groups of image sensors further comprise a second group of image sensors, and the operation method further comprises:

in a second period different from the first period, allowing the light source array to operate to provide a second photosensitive light source, allowing the second group of image sensors, which is capable of receiving second light emitted by the second photosensitive light source and reflected by the texture, to be in a state of sensing and generating a detection electrical signal, and allowing at least one group of image sensors that is capable of receiving the second light except the second group of image sensors to be in a state of not sensing and not generating a detection electrical signal, wherein the first photosensitive light source does not overlap with the second photosensitive light source, wherein each image sensor of the plurality of groups of image sensors comprises a photosensitive component, allowing the first group of image sensors to be in the state of sensing and generating the detection electrical signal and allowing the at least one group of image sensors except the first group of image sensors to be in the state of not sensing and not generating the detection electrical signal comprise:
  allowing photosensitive components in the first group of image sensors to be under negative bias, and allowing photosensitive components in the at least one group of image sensors except the first group of image sensors to be under non-negative bias,
wherein a first terminal of each of the photosensitive components of a same group of the plurality of groups of image sensors is connected with a same bias line, photosensitive components of different groups of image sensors are respectively connected with different bias lines, and the different bias lines are respectively connected with a bias bus through first switch components; and
the operation method comprises:
  in the first period, turning on a first switch component connected with the bias line which is connected with the first group of image sensors, and
  in the second period, turning on a first switch component connected with the bias line which is connected with the second group of image sensors,
wherein each group of the plurality of groups of image sensors comprises of at least two non-adjacent rows of image sensors.

2. The operation method according to claim 1, wherein the texture recognition device comprises a pixel unit array, wherein the pixel unit array comprises a plurality of pixel units, and each of the plurality of pixel units comprises one light emitting component; the plurality of light sources comprise light emitting components of the plurality of pixel units; and the plurality of pixel units comprise a first group of pixel units that are arranged continuously;
  allowing the light source array to operate to provide the first photosensitive light source comprises:
  in the first period, lighting the first group of pixel units to form a first line light source as the first photosensitive light source.

3. The operation method according to claim 1, wherein the non-negative bias comprises positive bias or zero bias.

4. The operation method according to claim 1, wherein the image sensor array comprises a plurality of columns, each group of the plurality of groups of image sensors comprises image sensors in the plurality of columns, and
  for a same column of the plurality of columns, a same group of the plurality of groups of image sensors are connected with a same signal readout line, different groups of image sensors are respectively connected with different signal readout lines, and the different signal readout lines are respectively connected with a signal readout bus through second switch components; and
  the operation method comprises:
    in the first period, turning on a second switch component connected with the signal readout line which is connected with the first group of image sensors, and
    in the second period, turning on a second switch component connected with the signal readout line which is connected with the second group of image sensors.

5. The operation method according to claim 1, wherein the plurality of groups of image sensors comprise a third group of image sensors, and
  the operation method further comprises:
    in a third period different from the first period and the second period, allowing the light source array to operate to provide a third photosensitive light source, allowing the third group of image sensors, which is capable of receiving third light emitted by the third photosensitive light source and reflected by the texture, to be in a state of sensing and generating a detection electrical signal, and allowing at least one group of image sensors that is capable of receiving the third light except the third group of image sensors to be in a state of not sensing and not generating a detection electrical signal, wherein
  the third photosensitive light source does not overlap with the first photosensitive light source, and the third photosensitive light source does not overlap with the second photosensitive light source.

6. A texture recognition device, comprising:
  a light source array comprising a plurality of light sources; and
  an image sensor array comprising a plurality of groups of image sensors,
  wherein each group of the plurality of groups of image sensors comprises a plurality of image sensors, and the image sensor array is configured to receive light emitted from the light source array and reflected to the image sensor array by a texture for a texture collection; and
  the image sensor array comprises a first group of image sensors and at least one group of image sensors except the first group of image sensors, and is configured to allow the first group of image sensors to be in a state of sensing and generating a detection electrical signal while allowing the at least one group of image sensors except the first group of image sensors to be in a state of not sensing and not generating a detection electrical signal,
    wherein each image sensor of the plurality of groups of image sensors comprises a photosensitive component, a first terminal of each photosensitive component of a same group of the plurality of groups of image sensors is connected with a same bias line, photosensitive components of different groups of image sensors are respectively connected with different bias lines, and the different bias lines are respectively connected with a bias bus through first switch components, and the different bias lines are respectively connected with a bias bus through first switch components;
  wherein, during a first period, a first switch component, connected with the bias line which is connected with the first group of image sensors, is turned on; and
  wherein, during a second period, a first switch component connected with the bias line which is connected with a different group of image sensors, is turned on;
  wherein each group of the plurality of groups of image sensors comprises of at least two non-adjacent rows of image sensors.

7. The texture recognition device according to claim 6, wherein the image sensor array further comprises a second group of image sensors, and is further configured to allow the second group of image sensors to be in a state of sensing and generating a detection electrical signal while allowing at least one group of image sensors except the second group of image sensors to be in a state of not sensing and not generating a detection electrical signal.

8. The texture recognition device according to claim 7, further comprising a controller, wherein the controller is configured to,
in a first period, control the light source array to operate to provide a first photosensitive light source, allow the first group of image sensors, which is capable of receiving first light emitted by the first photosensitive light source and reflected by the texture, to be in a state of sensing and generating a detection electrical signal, and allow at least one group of image sensors that is capable of receiving the first light except the first group of image sensors to be in a state of not sensing and not generating a detection electrical signal; and
in a second period, control the light source array to operate to provide a second photosensitive light source, allow the second group of image sensors, which is capable of receiving second light emitted by the second photosensitive light source and reflected by the texture to be, in a state of sensing and generating a detection electrical signal, and allow at least one group of image sensors that is capable of receiving the second light except the second group of image sensors to be in a state of not sensing and not generating a detection electrical signal,
wherein the first photosensitive light source does not overlap with the second photosensitive light source.

9. The texture recognition device according to claim 8, further comprising a pixel unit array, wherein the pixel unit array comprises a plurality of pixel units, and each of the plurality of pixel units comprises one light emitting component;
the plurality of light sources comprise light emitting components of the plurality of pixel units; the plurality of pixel units comprise a first group of pixel units that are arranged continuously; and
the controller is further configured to light the first group of pixel units to form the first photosensitive light source in the first period.

10. The texture recognition device according to claim 9, wherein each of the plurality of pixel units further comprises one image sensor of the plurality of groups of image sensors, and the plurality of light emitting components and the plurality of groups of image sensors are in a same layer and are spaced apart from each other.

11. The texture recognition device according to claim 9, further comprising:
a color filter layer, which is at least at a light input side of the image sensor array, and configured to filter light of a wavelength larger than 600 nm.

12. The texture recognition device according to claim 11, wherein the color filter layer comprises a planarization layer, or the color filter layer comprises a pixel defining layer, or the color filter layer comprises the planarization layer and the pixel defining layer.

13. The texture recognition device according to claim 12, wherein the light emitting component comprises an organic light emitting diode or a quantum dot light emitting diode.

14. The texture recognition device according to claim 6, wherein the image sensor array comprises a plurality of columns, each group of the plurality of groups of image sensors comprises image sensors in the plurality of columns, and
for a same column of the plurality of columns, a same group of the plurality of groups of image sensors are connected with a same signal readout line, different groups of image sensors are respectively connected with different signal readout lines, and the different signal readout lines are respectively connected with a signal readout bus through second switch components.

15. The texture recognition device according to claim 14, wherein a control electrode of the first switch component and a control electrode of the second switch component, in which the first switch component and the second switch component are connected with a same group of the plurality of groups of image sensors, are connected with a same selection line, and
a control electrode of the first switch component and a control electrode of the second switch component, in which the first switch component and the second switch component are connected with different groups of the plurality of groups of image sensors, are connected to different selection lines, respectively.

* * * * *